United States Patent
Ma et al.

(10) Patent No.: US 12,076,746 B2
(45) Date of Patent: Sep. 3, 2024

(54) SURFACING MATERIALS AND METHOD OF MANUFACTURE, INCLUDING A TEXTURED PRESS PLATE FOR USE IN THE MANUFACTURE OF DECORATIVE LAMINATE

(71) Applicant: WILSONART LLC, Austin, TX (US)

(72) Inventors: Muyuan M Ma, Austin, TX (US); Rajesh Ramamurthy, Temple, TX (US); Mahesh Subramanian, Centerville, OH (US); Jin Chao, Shanghai (CN)

(73) Assignee: Wilsonart LLC, Austin, TX (US)

( * ) Notice: Subject to any disclaimer, the term of this patent is extended or adjusted under 35 U.S.C. 154(b) by 636 days.

(21) Appl. No.: 16/818,556

(22) Filed: Mar. 13, 2020

(65) Prior Publication Data

US 2020/0290240 A1    Sep. 17, 2020

Related U.S. Application Data

(60) Provisional application No. 62/819,214, filed on Mar. 15, 2019.

(51) Int. Cl.
| | | |
|---|---|---|
| B05D 3/06 | (2006.01) |
| B29C 33/38 | (2006.01) |
| B29C 70/34 | (2006.01) |
| B30B 15/02 | (2006.01) |
| B30B 15/06 | (2006.01) |
| B32B 15/082 | (2006.01) |
| B32B 27/08 | (2006.01) |
| B44B 5/02 | (2006.01) |

| C09D 5/28 | (2006.01) |
| C09D 175/16 | (2006.01) |
(Continued)

(52) U.S. Cl.
CPC .......... *B05D 3/067* (2013.01); *B29C 33/3842* (2013.01); *B29C 70/345* (2013.01); *B30B 15/02* (2013.01); *B30B 15/062* (2013.01); *B32B 15/082* (2013.01); *B32B 27/08* (2013.01); *B44B 5/026* (2013.01); *C09D 5/28* (2013.01); *C09D 175/16* (2013.01); *C23C 16/482* (2013.01); *B29L 2009/00* (2013.01)

(58) Field of Classification Search
CPC ... B05D 3/067; B29C 33/3842; B29C 70/345; B30B 15/02; B30B 15/062; B32B 15/082; B32B 27/08; B44B 5/026; C23C 16/482; B29L 2009/00; C09D 5/28; C09D 175/16
See application file for complete search history.

(56) References Cited

U.S. PATENT DOCUMENTS

| 4,747,901 A | 5/1988 | Becker et al. |
| 6,656,329 B1 | 12/2003 | Ma et al. |
| 2002/0136862 A1 | 9/2002 | Dong et al. |
(Continued)

*Primary Examiner* — Robert S Walters, Jr.
(74) *Attorney, Agent, or Firm* — Welsh Flaxman & Gitler LLC

(57) ABSTRACT

A textured press plate for use in the manufacture of decorative laminate is provided. The textured press plate is manufactured by the method include the steps of applying a UV curable acrylate mixture to a surface of a press plate substrate, irradiating the UV curable acrylate mixture with LED precure by excimer UV to create a UV-irradiated layer having a surface exhibiting micro-folding, and fully curing the UV-irradiated layer to form a textured coating layer.

9 Claims, 5 Drawing Sheets

(51) Int. Cl.
*C23C 16/48* (2006.01)
*B29L 9/00* (2006.01)

(56) References Cited

U.S. PATENT DOCUMENTS

| | | |
|---|---|---|
| 2014/0371384 A1 | 12/2014 | Fischer et al. |
| 2015/0191042 A1 | 7/2015 | Ma et al. |
| 2018/0050527 A1 | 2/2018 | Ma et al. |
| 2019/0077138 A1* | 3/2019 | Ma ........................ B32B 27/36 |
| 2019/0091983 A1 | 3/2019 | Krebs |

* cited by examiner

FIG. 5

SURFACING MATERIALS AND METHOD OF MANUFACTURE, INCLUDING A TEXTURED PRESS PLATE FOR USE IN THE MANUFACTURE OF DECORATIVE LAMINATE

CROSS REFERENCE TO RELATED APPLICATION

This application claims the benefit of U.S. Provisional Patent Application Ser. No. 62/819,214, entitled "SURFACING MATERIALS AND METHOD OF MANUFACTURE," filed Mar. 15, 2019.

BACKGROUND OF THE INVENTION

1. Field of the Invention

The present invention generally relates to surfacing materials and methods for manufacturing the materials.

2. Description of the Related Art

High pressure decorative laminates are currently manufactured with smooth glossy surfaces, textured surfaces, or deeply sculpted and embossed surfaces. As general background, decorative laminates prepared by heat and pressure consolidation have been produced commercially for a number of years, and have found widespread acceptance in the building and furniture industry as countertop and tabletops, bathroom and kitchen work surfaces, wall paneling, flooring products, partitions and doors. These decorative laminates may be described as containing a number of laminae consolidated to form a unitary structure carrying a surface decoration. The surface decoration may range from something as simple as a solid color to something as complex as an embossed simulated wood grain finish.

Decorative laminates generally include plural layers of synthetic resin impregnated paper sheets bonded under heat and pressure to form a unitary structure. In normal practice, a decorative laminate sheet assembly, from the bottom up, includes a core of one or more phenolic resin impregnated sheets, above which lies a decorative melamine-formaldehyde impregnated sheet. The decorative sheet may be further covered with a melamine-formaldehyde impregnated overlay. The core, or base, functions to impart rigidity to the decorative laminate and usually includes a solid substrate which may, or may not, be formed prior to the initial laminating steps. Prior to stacking, the sheets of the core member are impregnated with a water alcohol solution of phenol formaldehyde, dried and partially cured in a hot oven, and finally cut into shapes.

The core may, for example, include a plurality of sheets of 90-150 pound phenolic resin impregnated Kraft paper. The Kraft paper is impregnated throughout and bonded with a substantially completely cured phenolic resin which has been converted to a thermoset state during the initial laminating step. The substrate may be a pre-cured plastic laminate, such as glass fiber-reinforced thermoset polyester resin laminates and the like, a wood product, such as hardboard, wood waste or particle boards, plywood and the like, a mineral base board, such as, cement-asbestos board, sheet rock, plaster board, and the like, or a combination of substrates.

The decorative sheet provides the decorative laminate with an attractive appearance. The decorative sheet also dictates the surface characteristics of the decorative laminate. For example, the composition of the decorative sheet dictates the decorative laminate's resistance to chemical agents, heat, light, shock and abrasion. Decorative sheets are commonly manufactured from high quality 50-125 pounds per 3,000 square ft. ream basis weight (80-202 grams per square meter), pigment filled, alpha-cellulose paper impregnated with a water alcohol solution of melamine-formaldehyde resin. The resin impregnated decorative sheets are subsequently dried, partially cured, and finally cut into sheets. The pigment filled, alpha-cellulose paper of the decorative sheet, may include a solid color, a decorative design, or a roto-gravure reproduction of natural materials, such as, wood, marble, leather, etc. The aesthetic characteristics of the cellulose paper are revealed as the laminate's decorative design upon completion of the decorative laminate.

Decorative laminates are generally manufactured by placing the resin impregnated core and decorative sheet between steel plates and subjecting the decorative laminate stack to heat and pressure for a time sufficient to consolidate the laminate and cure the resins (generally about 25 minutes to an hour). The pressure and heat force the resin in the paper sheets to flow, cure, and consolidate the sheets into a unitary laminated mass referred to in the art as a decorative high pressure laminate. Finally, the formed decorative laminate is bonded to a reinforcing substrate, such as, plywood, hardboard, asbestos board, particle board or the like.

Generally, more than one laminate is formed at one time. Multiple laminates are formed by inserting a plurality of decorative laminate sheet assemblies into a stack. Release sheets are positioned between the decorative laminate sheet assemblies to separate the various laminates stacked together. After consolidation, the release sheets allow the individual laminates to be separated.

Textured decorative laminates are also very popular. The textured surfaces range from relatively shallow depressions, such as, textured (e.g., satin, matte or semi-gloss) surfaces, to relatively deeply sculpted or embossed surfaces having a noticeable three-dimensional effect, such as, wood grain, leather, slate, abstract patterns, creative designs etc. The textured laminates are commonly manufactured using release sheets with the desired surface texture, which surface texture is imparted to the decorative laminate during the application of heat and pressure in the manufacturing process.

It has, however, been found that high pressure decorative laminates are susceptible to a build-up of fingerprints as the surface of the high pressure decorative laminate is touched during the course of the day. The fingerprints remain visible and can become highly distracting. Prior attempts to address this problem have relied upon chemically modified surfaces to achieve the purpose. However, such attempts have only led to limited success. As such, a need remains for a high pressure decorative laminate that is not susceptible to the build-up of fingerprints on the surface thereof.

SUMMARY OF THE INVENTION

According to a first aspect there may be provided a textured press plate for use in the manufacture of decorative laminate. The textured press plate is manufactured by the method include the steps of applying a UV curable acrylate mixture to a surface of a press plate substrate, irradiating the UV curable acrylate mixture with LED precure by excimer UV to create a UV-irradiated layer having a surface exhibiting micro-folding, and fully curing the UV-irradiated layer to form a textured coating layer.

In some embodiments the step of irradiating includes treating the UV curable acrylate mixture so that the UV cured acrylate mixture is only crosslinked on a surface thereof to produce a supermatting surface through microconvolution.

In some embodiments the step of irradiating is achieved with an excimer emitter based on a Xe-emission spectrum at a wavelength of 172 nm in a presence of nitrogen.

In some embodiments the UV curable acrylate mixture is a solvent-free and non-aqueous lacquer.

In some embodiments the solvent-free and non-aqueous lacquer is an epoxy acrylic or a urethane acrylic.

In some embodiments the method further includes the step of applying a $TiB_2$ hard coating to the textured coating layer.

In some embodiments the step of applying includes applying the UV curable acrylate mixture to the press plate substrate with a roller.

In some embodiments the step of applying includes applying the UV curable acrylate mixture to the press plate substrate with a layer thickness greater than 5 microns.

In some embodiments the step of applying includes applying the UV curable acrylate mixture to the press plate substrate with a layer thickness of 30 to 100 microns.

In some embodiments the step of fully curing by E-beam or UV irradiation includes the step of applying the UV curable acrylate mixture to the press plate substrate with a roller.

In a further aspect a textured press plate includes a press plate substrate and a textured coating layer applied to the press plate substrate, wherein the textured coating layer is comprised of a UV curable acrylate mixture.

Additional advantages of the embodiments will be set forth in part in the description which follows, and in part will be understood from the description, or may be learned by practice of the invention. The advantages will be realized and attained by means of the elements and combinations particularly pointed out in the appended claims.

BRIEF DESCRIPTION OF THE DRAWINGS

FIGS. 4 and 5 are schematics showing the formation of the textured press plate shown in FIG. 3.

DESCRIPTION OF THE PREFERRED EMBODIMENTS

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as a basis for teaching one skilled in the art how to make and/or use the invention.

Figure 1:
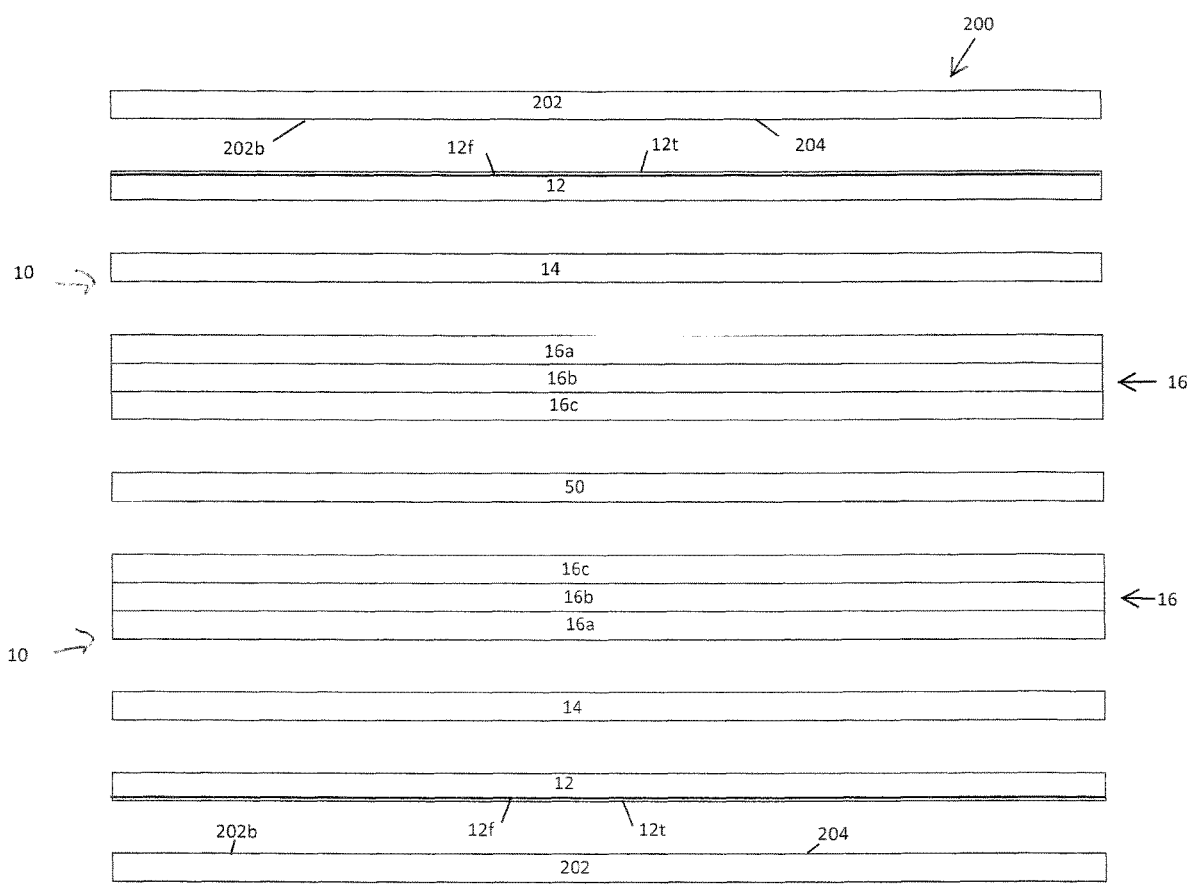
FIG. 1 is a schematic of a laminate lay-up within a platen press.
Figure 2:
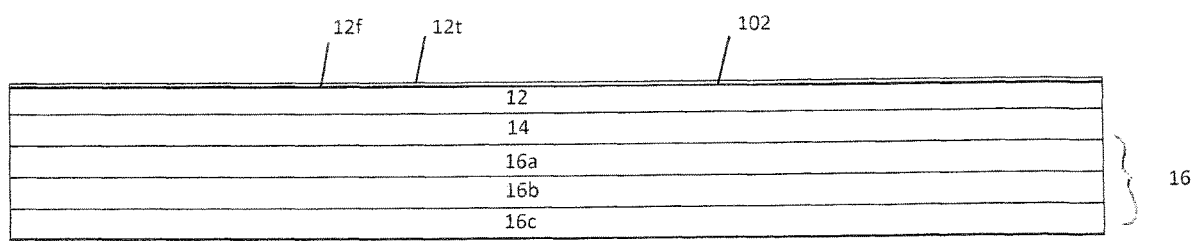
FIG. 2 is a schematic of a decorative laminate in accordance with the present invention period

With reference to FIG. 1, a decorative laminate lay-up 10 composed of an exterior overlay paper layer 12, a decorative layer 14, and a core layer 16 is disclosed. The decorative laminate lay-up 10 is pressed in a conventional platen press 200. However, the platen press 200 employs a textured press plate 202 treated in a highly specific manner to produce a decorative laminate 100 (see FIG. 2) exhibiting desirable anti-fingerprint characteristics. As will be explained below in more detail, the textured press plate 202 imparts a textured matte surface 102 (formed on a bottom side 202b thereof) to a resulting decorative laminate 100, wherein the textured matte surface 204 of the textured press plate 202 results in a decorative laminate 100 that exhibits a matte appearance and is not susceptible to a build-up of fingerprints on the surface thereof.

While a preferred embodiment disclosed herein includes an overlay paper layer, it is appreciated the decorative laminate lay-up may be assembled without an overlay paper layer.

The decorative laminate lay-up 10 is assembled by manufacturing the various layers in a conventional manner and then stacking the various layers in a conventional manner, that is, the sheets used in the production of the decorative laminate 100 are stacked in preparation for the heating and pressure steps used to consolidate the laminate. A textured press plate 202 composed of a press plate substrate 206 (that is, the conventional structure of the press plate commonly composed of stainless steel, preferably 410 grade stainless steel, 304 grade stainless steel or Bohler 630 stainless steel, although a wide variety of plate materials may be used without departing from the spirit of the present invention) and a textured coating layer 208 defining the textured matte surface is also prepared.

The process for producing surface effects in a release coating as disclosed in European Patent Application Publication No. 2527408, entitled "Method for Producing a Film with a Matt Surface," which is incorporated herein by reference, is employed in the manufacture of the textured press plate 202 used in accordance with the present invention. Briefly, the '408 publication teaches a technique for producing surface effects on a sheet. In accordance with the disclosed methodology a coating of an electron beam radiation curable material is applied to one surface of the press plate, and subsequently cured (ultimately producing the textured coating layer with the textured matte surface of the press plate in accordance with the present invention).

The application of the surface forming techniques of the '408 publication are applied in the present invention in a manner resulting in a textured press plate 202 with a textured matte surface 204. The textured matte surface 204 exhibits good matting properties (and correspondingly low degrees of gloss as defined in and measured in accordance with DIN EN ISO 2813) having improved scratch resistance properties. Ultimately, and as will be explained below in greater detail, the textured press plate 202 is ultimately utilized as a texture imparting surface in the manufacture of decorative laminate 100.

Figure 3:
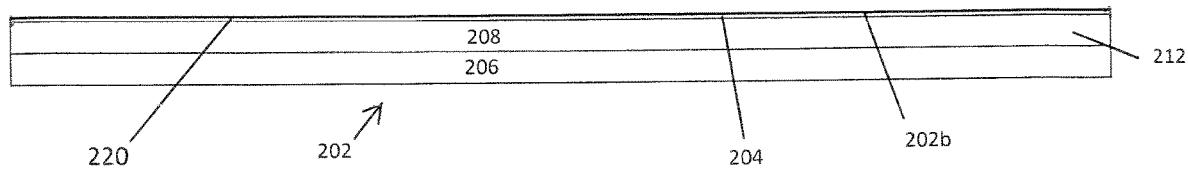
FIG. 3 is a schematic of textured press plate in accordance with the present invention.
Figure 4:
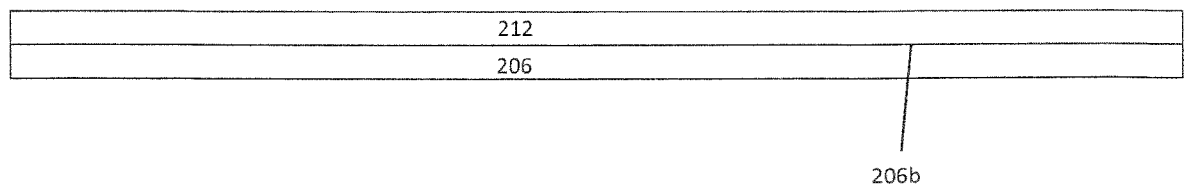

With reference to FIG. 3, the textured press plate 202 of the present invention, employs a UV (ultraviolet) curable acrylate mixture 212 composed of a solvent-free and non-aqueous lacquer (in accordance with the present invention the lacquer is preferably an epoxy acrylic or a urethane acrylic (also referred to herein as the UV curable acrylate mixture) in the production of the textured coating layer 208 on the press plate substrate 206. The matte textured press plate 202 is produced through the implementation of a two-stage irradiation process. First, and with reference to FIG. 4, the UV curable acrylate mixture 212 (which is ultimately cured to form the textured coating layer 208) is laid, or otherwise applied, upon the bottom surface 206b of a conventional press plate, which defines the press plate substrate 206 of the resulting textured upper pressure plate 202.

Figure 5:
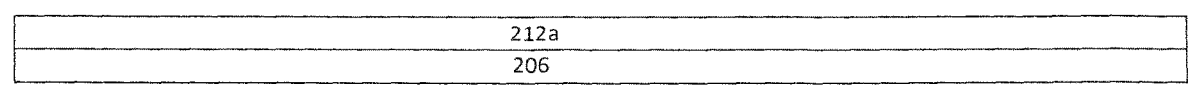

The UV curable acrylate mixture 212 (which is ultimately cured to form the UV cured coating) applied upon the press plate substrate 206 is then irradiated with LED (light emitting diode) precure by excimer UV to create a UV-irradiated layer 212a having a surface exhibiting micro-folding (see FIG. 5). In particular, the irradiation is applied so that UV cured acrylate mixture 212 is neither hardened nor is the entire layer of UV curable acrylate mixture 212 crosslinked. Rather the UV curable acrylate mixture 212 is only crosslinked on the surface thereof, which produces a supermatting surface through the effects of a micro-convolution. In accordance with a preferred embodiment, the UV-radiation irradiates via an excimer emitter based on a Xe-emission spectrum at a wavelength of 172 nm in the presence of nitrogen.

The UV-irradiated layer 212a (on the press plate substrate 206) is then fully cured by E-beam (electron beam) or UV irradiation (i.e. 200-400 nm). In particular, the UV-irradiated layer 212a partially cured by excimer can also be is then subjected to an electron beam irradiation to crosslink and harden the entire layer and form the final textured coating layer 208 of the textured press plate 202 without the UV-irradiation.

Once the final curing is completed, the final textured coating layer 212b of the textured press plate 202 is coated with a $TiB_2$ hard coating 220 to protect the micro-structure for longevity after the HPL (high pressure laminate)/LPL (low pressure laminate) pressing thereof is completed. The textured press plate 202 is coated with $TiB_2$ using the technique disclosed in U.S. Patent Application Publication No. 2017/0226630, entitled "METHOD FOR COATING STAINLESS STEEL PRESS PLATES AND COATED PRESS PLATES PRODUCED THEREBY", which is incorporated herein by reference.

This procedure initially creates a shrinking process in the UV curable acrylate mixture 212 that ultimately becomes the UV cured textured coating layer 208 and thus the desired matting directly on the surface of the resulting textured press plate 202. The production of a textured matte surface is achieved according to the '408 publication with 100% lacquers, to which no separate matting agent (such as silica or the like) is added. The curing and cross-linking of the total layer by means of electron beam irradiation fixes the matte surface created by the partial curing and irradiation without influencing the matte surface in any adverse manner. The matte textured press plate 202, and ultimately the decorative laminate 100 produced in this manner is distinguished by outstanding matting properties, which gloss levels to less than 3 (measured in accordance with the cited DIN EN ISO 2813 and 60° geometry) or less than 5 (corresponding at 85° geometry) can be reached.

In accordance with a preferred embodiment, the UV curable acrylate mixture 212 is preferably applied to the press plate substrate 206 by a roller, with a layer thickness greater than 5 microns and up to approximately 150 microns (preferably, 30 to 100 microns).

The UV curable acrylate mixture 212 is composed of a formulation having the following composition:
- 60% to 90%, by weight, urethane acrylate;
- 8% to 38%, by weight, reactive diluent, such as, isobornyl acrylate;
- 1.0% to 10%, by weight, photo initiator, for example, a combination of 0.5% to 5% by weight benzophenone and 0.5% to 5% by weight triethanol amine.

In accordance with a preferred embodiment, the UV curable acrylate mixture 212 has the following composition (when electron beam is used to complete the final curing, no photoinitiators will be used in the formulation):
- 40-44% Ebecryl® 294/HD 25 (an aliphatic urethane triacrylate oligomer diluted with 1,6-hexanediol diacrylate (HDDA)(1) monomer).
- 36-40% Ebecryl® 5129 (a hexafunctional aliphatic urethane acrylate oligomer which provides fast cure response when exposed to ultraviolet light or electron beam).
- 7-11% Ebecryl® 8209 (a Sn-free aliphatic urethane acrylate oligomer which provides extremely fast cure response when exposed to ultraviolet (LV) light or electron beam (EB)).
- 5% HDDA/TMPTA (Hexanediol diacrylate (HDDA) is a difunctional reactive diluent that is commonly used as a component of ultraviolet light (UV) and electron beam (EB) curable coatings and inks. Trimethylolpropane triacrylate (TMPTA) is a trifunctional monomer used for its low volatility and fast cure response.)
- 2% Photoinitiator With the laminate lay-up 10 and the textured press plate 202 prepared, heat and pressure are then applied to the laminate lay-up 10 using the textured press plate 202 in a conventional manner. The heat and pressure are applied in manner sufficient to bond the layers of the laminate lay-up 10, and releasably bond the textured press plate 202 (in particular, the bottom side 202b with the textured matte surface 204) to the top surface of the decorative laminate lay-up 10). Finally, the textured press plate 202 is removed from the top layer of the formed decorative laminate 100 to reveal a decorative laminate exhibiting desired matte texture characteristics.

In accordance with an embodiment of the present invention, and as discussed above, the textured press plate 202 is formed with a textured matte surface 204 on the bottom side 202b thereof (the texture of which is ultimately applied to the top surface of the decorative laminate 100) exhibiting matte surface characteristics leading to a fingerprint proof surface, that is, a surface not showing fingerprints and remaining clean and clear despite regular use.

The texture of the textured matte surface 204 applied to the textured press plate 202 is ultimately applied to the top surface of the resulting decorative laminate 100 as texture resulting in a textured top surface of the resulting decorative laminate 100) with a matte surface. When the textured matte surface 204 (that is, the texture) of the textured press plate 202 is applied to the decorative laminate 100 as discussed below in greater detail, the top surface of the decorative laminate 100 is imparted with a texture (that is, the decorative laminate is provided with a textured surface) the same as the texture of the textured matte surface 204 of the textured press plate 202 making the laminate 100 less susceptible to the formation of annoying and undesirable fingerprints thereon.

Summarizing, when such texture is applied to the top surface of the decorative laminates 100 so as to provide for a textured top surface, the resulting characteristics result in the formation of a laminate 100 not susceptible to the formation of annoying and undesirable fingerprints.

As the textured matte surface 204 of the textured press plate 202 is ultimately imparted to the top layer (that is, the texture of the top surface of the overlay paper layer 12 in accordance with an embodiment of the present invention) of the decorative laminate 100 formed using the textured press plate 202, the resulting decorative laminate 100 is provided with a top surface having texture that is the same as that of the textured matte surface 204 and will exhibit desired resistance to the formation of fingerprints.

In accordance with one embodiment of the present invention, and as discussed above, the decorative laminate includes an exterior overlay layer sheet, or top layer 12, a decorative sheet 14 and a core layer 16. While a specific layering pattern is disclosed in accordance with a preferred embodiment of the present invention, the layering pattern may be varied, somewhat, without departing from the spirit of the present invention.

The overlay paper layer 12 is preferably a melamine-formaldehyde impregnated paper layer. The overlay paper layer 12 is preferably manufactured from a low basis weight transparent sheet impregnated with resin, for example, melamine-formaldehyde. The resin impregnated overlay paper layer 12 is subsequently dried, partially cured and finally cut into sheets. In accordance with a preferred embodiment, the overlay paper layer 12 is B-stage cured and is then coated with a UV curable epoxy acrylic or urethane acrylic film 12f that is also partially cured (and ultimately defines the top surface of the overlay paper layer) prior to the platen pressing process that ultimately completes the curing process.

The UV curable epoxy acrylic or urethane acrylic film 12f is generally composed of:
- 60°% to 90%, by weight, urethane acrylate;
- 8% to 38%, by weight, reactive diluent, such as, isobornyl acrylate;
- 1.0% to 10%, by weight, photo initiator, for example, a combination of 0.50% to 5% by weight benzophenone and 0.5% to 5% by weight triethanol amine; and
- 0.5% to 5%, by weight, a thermal initiator, for example, tert-Butyl peroxybenzoate.

In accordance with a specific embodiment, the composition from which the UV curable epoxy acrylic or urethane acrylic film is formed is as follows:
- 42% Ebecryl® 294/HD 25 (an aliphatic urethane triacrylate oligomer diluted with 1,6-hexanediol diacrylate (HDDA)(1) monomer).
- 38% Ebecryl® 5129 (a hexafunctional aliphatic urethane acrylate oligomer which provides fast cure response when exposed to ultraviolet light or electron beam).
- 9% Ebecryl® 8209 (a Sn-free aliphatic urethane acrylate oligomer which provides extremely fast cure response when exposed to ultraviolet (LV) light or electron beam (EB)).
- 5% HDDA/TMPTA (Hexanediol diacrylate (HDDA) is a difunctional reactive diluent that is commonly used as a component of ultraviolet light (UV) and electron beam (EB) curable coatings and inks. Trimethylolpropane triacrylate (TMPTA) is a trifunctional monomer used for its low volatility and fast cure response.)
- 2% Photoinitiator
- 2% Cerafak 127N (a Fischer Tropsch wax dispersion. Provides improved water repellence properties).
- 1% TBPB (tert-Butyl peroxybenzoate (TBPB) a chemical compound from the group of peresters which functions as a radical initiator in a polymerization process, that is, a thermal initiator).
- 1% Modaflow 9200 (an acrylic flow modifier, without silicone addition. It improves flow and leveling, substrate wetting, or maintains high gloss and substrate and inter-coat adhesion, and facilitates pigment dispersion).

While the paper may exhibit opaque properties prior to heating and pressing, the overlay paper layer 12 in the final fabricated laminate 100 is preferably transparent to permit viewing of the decorative sheet 14 positioned directly beneath the overlay paper layer 12. The overlay paper used in accordance with an embodiment of the present invention is a low weight basis alpha-cellulose paper with a high porosity for resin absorption. The decorative layer 14 is a conventional pattern sheet positioned directly beneath the overlay paper layer 12. When the decorative laminate 100 is fully heated and pressed, as will be discussed below in greater detail, the overlay paper layer 12 becomes translucent, fully exposing the decorative layer 14. In addition, it is the top surface 12t of the overlay paper layer 12 which takes on the texture imparted by the press plate 202.

Decorative layers 14 are chosen from a wide array of sheets. For example, the decorative layer 14 may be a solid color (for example, white) or include an aesthetically appealing pattern. As discussed above, the decorative layer 14 provides the decorative laminate with an attractive appearance. The overlay paper layer 12 and the decorative layer 14 also dictate the surface characteristics of the final decorative laminate 100. For example, the composition of the overlay paper layer 12 and decorative layer 14 help to dictate the decorative laminate's resistance to chemical agents, heat, light, shock and abrasion.

Decorative sheets are commonly manufactured from high quality 80-202 grams per square meter ream weight, pigment filled, alpha cellulose paper impregnated with a water alcohol or water solution of melamine-formaldehyde resin. The resin impregnated decorative sheets are subsequently dried, partially cured, and finally cut into sheets. The pigment filled, alpha cellulose paper of the decorative sheet, may include a solid color, a decorative design, or a photogravure reproduction of natural materials, such as, wood, marble, leather, etc. The aesthetic characteristics of the cellulose paper are revealed as the laminate's decorative design upon completion of the decorative laminate.

The core layer 16 is preferably composed of a plurality of phenolic resin impregnated sheets 16a-d, although other materials may be used without departing from the spirit of the present invention. For example, the core layer 16 includes sheets of 120-323 grams per square meter dry phenolic resin impregnated Kraft paper. The Kraft paper is impregnated throughout and bonded with a substantially cured phenolic resin which is converted to a thermoset state during the initial laminating step.

In accordance with an embodiment of the present invention, the decorative laminate 100 of the present invention is formed in much the same manner as conventional decorative laminates. The layers are first stacked and placed between steel plates. Release sheets may be used if necessary. The decorative laminate lay-up 10 (or stack) is then subjected to temperatures in the range of 121° C.-160° C. and pressures of about 56.24 kg/cm$^2$ to 112.48 kg/cm$^2$ for a time sufficient to consolidate the laminate and cure the resins (generally about 25 minutes to an hour). The pressure and heat force the resin in the paper sheets to flow, cure and consolidate the sheets into a unitary laminated mass referred to in the art as a decorative high pressure laminate 100 having the hydrophobic textured surface as described above which is imparted by the textured matte surface 204 of the textured press plate 202.

Generally, more than one decorative laminate is formed at one time. As shown with reference to FIG. 1, multiple decorative laminates 100 are formed by inserting a plurality of lay-ups 10 in a stack. Conventional release sheets 50 are positioned between the core layers 16 of the lay-ups 10 to separate the various decorative laminates 100 stacked together. The textured matte surface 204 of the textured press plate 202 is oriented against the top surface (in this case the upper surface of the overlay paper layer 12) of the decorative laminate lay-up 10, be it the overlay paper layer 12 (or the decorative layer where an overlay is not used). Upon pressing between textured press plates 202 in accordance with the present invention, the textured press plate 202 imparts the matte texture described above to the top surface of the first lay-up layer (in this case the upper surface of overlay paper layer 16). A platen press assembly 200, as is well known in the lamination art, provides the necessary heat and/or pressure during lamination. After consolidation, the release sheets allow the individual decorative laminates to be separated.

While the preferred embodiments have been shown and described, it will be understood that there is no intent to limit the invention by such disclosure, but rather, is intended to cover all modifications and alternate constructions falling within the spirit and scope of the invention.

The invention claimed is:

1. A textured press plate for use in manufacture of decorative laminate, the textured press plate being manufactured by the method comprising:
    applying a UV curable acrylate mixture directly to a surface of a press plate substrate, the UV curable acrylate mixture comprising an aliphatic urethane triacrylate oligomer, an aliphatic urethane acrylate oligomer, and a reactive diluent;
    irradiating the UV curable acrylate mixture that has been applied to the press plate substrate with an excimer emitter such that the UV curable acrylate mixture is only crosslinked on a surface thereof to create a UV-irradiated layer having a surface exhibiting micro-folding; and
    fully curing the UV-irradiated layer to form a textured coating layer on the surface of the press plate.

2. The textured press plate according to claim 1, wherein the step of irradiating includes treating the UV curable acrylate mixture so that the UV curable acrylate mixture is only crosslinked on a surface thereof to produce a super-matting surface through micro-convolution.

3. The textured press plate according to claim 2, wherein the step of irradiating is achieved with the excimer emitter based on a Xe-emission spectrum at a wavelength of 172 nm in a presence of nitrogen.

4. The textured press plate according to claim 1, wherein the UV curable acrylate mixture is a solvent-free and non-aqueous lacquer.

5. The textured press plate according to claim 1, wherein the step of fully curing is by E-beam or UV irradiation.

6. The textured press plate according to claim 5, further including a step of applying a $TiB_2$ hard coating to the textured coating layer.

7. The textured press plate according to claim 1, wherein the step of applying includes applying the UV curable acrylate mixture to the press plate substrate with a roller.

8. The textured press plate according to claim 1, wherein the step of applying includes applying the UV curable acrylate mixture to the press plate substrate with a layer thickness greater than 5 microns.

9. The textured press plate according to claim 1, wherein the step of applying includes applying the UV curable acrylate mixture to the press plate substrate with a layer thickness of 30 to 100 microns.

* * * * *